US005905750A

United States Patent [19]
Lebby et al.

[11] Patent Number: 5,905,750
[45] Date of Patent: May 18, 1999

[54] SEMICONDUCTOR LASER PACKAGE AND METHOD OF FABRICATION

[75] Inventors: Michael S. Lebby, Apache Junction; Wenbin Jiang; John W. Stafford, both of Phoenix, all of Ariz.

[73] Assignee: Motorola, Inc., Schaumburg, Ill.

[21] Appl. No.: 08/731,424

[22] Filed: Oct. 15, 1996

[51] Int. Cl.$^6$ .................................................. H01S 3/18
[52] U.S. Cl. .............................. 372/50; 372/43; 369/112
[58] Field of Search .................... 372/43, 50; 250/211 J; 369/44.12, 44.23, 112, 116; 438/107

[56] References Cited

U.S. PATENT DOCUMENTS

| | | | |
|---|---|---|---|
| 5,136,152 | 8/1992 | Lee ........................................ | 250/211 J |
| 5,352,632 | 10/1994 | Sawaya .................................... | 438/107 |
| 5,361,244 | 11/1994 | Nakamura et al. ................... | 369/44.23 |
| 5,577,064 | 11/1996 | Swirhun et al. ........................ | 372/50 |
| 5,608,695 | 3/1997 | Yamazaki .............................. | 369/44.12 |
| 5,629,919 | 5/1997 | Hayashi et al. ........................ | 369/112 |

FOREIGN PATENT DOCUMENTS

| | | | |
|---|---|---|---|
| 1-222492 | 9/1989 | Japan ..................................... | 372/43 |
| 2-125688 | 5/1990 | Japan ..................................... | 372/43 |
| 4-48672 | 2/1992 | Japan ..................................... | 372/43 |

*Primary Examiner*—Rodney B. Bovernick
*Assistant Examiner*—Yisun Song
*Attorney, Agent, or Firm*—Eugene A. Parsons

[57] ABSTRACT

A semiconductor laser package including a laser chip mounted to an uppermost surface of a leadframe, and a molded structure at least partially encapsulating the laser chip. The laser chip composed of a vertical cavity surface emitting laser and an optional photodetector. The vertical cavity surface emitting laser generating an emission along a path. The molded structure including an optical element positioned a specific distance from an emission aperture of the vertical cavity surface emitting laser. The laser chip and the optical element mounted in precise z-axis alignment from the emission aperture of the vertical cavity surface emitting laser utilizing the uppermost surface of the leadframe as a dimensional reference point.

24 Claims, 3 Drawing Sheets

SEMICONDUCTOR LASER PACKAGE AND METHOD OF FABRICATION

FIELD OF THE INVENTION

The present invention pertains to semiconductor lasers and more specifically to the packaging of semiconductor lasers.

BACKGROUND OF THE INVENTION

Since the development of laser diodes, many applications for their use have been developed. Increasingly, laser diodes are employed for communications and are integral to optical disc recording and storage systems. Typically, edge emitting diode lasers are used. Edge emitting diode lasers, however, have a high cost in parallel and serial data links, and have a high current drain due to a high threshold current when used in compact disc pickups.

New systems are being developed to employ vertical cavity surface emitting lasers (VCSELs) in place of edge emitting lasers. The VCSELs provide a much lower cost, use surface emissions which simplify optical devices and are capable of being fabricated in larger volumes on semiconductor wafers. However, a problem exists in the packaging of such VCSELs, namely the cost of materials employed in the typical "can" type packages and the steps that must be taken for achieving proper alignment, more particularly z-axis alignment, of the laser chip within the package due to variations in the thickness of the actual laser chip, the semiconductor wafer, or the like and its dimensional reference to an optical element. In addition, there exists a need to integrate a collimating lens into the package, that again is aligned relative to the z-axis and a specific reference point, so as to allow for ease in fabrication, typically employing automated assembly.

The conventional semiconductor laser apparatus utilizes a metal TO can for packaging, and includes the formation of a "window" within a cap portion of the can through which the laser emission passes. The laser chip is positioned within the can based on measurements specific for that chip. This positioning allows for variation of the chip thickness, etc., yet is not time or cost effective. In addition, in the typical metal can a "window" must be formed to allow for the passage of the emission. An external lens will be placed in the light path away from the window typically for beam focusing and shaping. More specifically, in the prior art, the laser package is designed to focus the beam into a diffraction limited spot, and does not employ any collimating means. Due to poor die placement accuracy by automated machine, typically ±80 $\mu$m, therefore manual z-axis alignment is needed to control the relative distance between the lens and the laser emission aperture. This procedure not only increases the system packaging cost, but also limits the manufacturing throughput.

In monitoring the power of these devices, generally, edge emitting laser diodes employ a power monitoring detector facing the back emission facet of the device. In a VCSEL with a wavelength shorter than 870 nm, there is no back emission due to the opaque substrate on which the device is necessarily formed. Accordingly, monitoring of the actual laser emission is required.

Therefore, there exists a need for improved packaging of vertical cavity surface emitting lasers, more specifically a package that utilizes existing leadframe technology, thus allowing for controlled alignment of the laser chip emission aperture along the z-axis, relative to an optical element, such as an integrated or separately formed collimating or focusing lens, so as to reduce the cost of manufacture and the complexity of system assembly. In addition, there is a need to incorporate into the package a monitoring system which will automatically control the emissions emitted by the VCSEL.

Thus there is a need for a lower cost semiconductor laser package that has included therein a leadframe, allowing for a means for aligning the laser chip so as to allow proper z-axis alignment of the laser emission aperture relative to an optical element, an optional power monitoring system, thus allowing for automatic power control (APC) of the VCSEL emission, which package utilizes low cost materials, and is simple to fabricate.

Accordingly, it is highly desirable and an object of this invention to provide for a low cost semiconductor laser package that incorporates proper z-axis alignment of the laser chip emission aperture relative to an optical element, such as a collimating lens.

It is another purpose of the present invention to provide for a new and improved semiconductor laser package that is fabricated using standard leadframe technology and molding techniques.

It is yet another purpose of the present invention to provide for a new and improved semiconductor laser package that is inexpensive and easily fabricated.

It is a still further purpose of the present invention to provide for a new and improved semiconductor laser package that allows for optional automatic power control of the VCSEL emission.

SUMMARY OF THE INVENTION

The above problems and others are substantially solved and the above purposes and others are realized in a semiconductor laser package including a laser chip, composed of a vertical cavity surface emitting laser generating an emission along a path and mounted to a leadframe fabricated utilizing standard leadframe technology. The laser chip can be formed as a VCSEL with an optional power monitoring system, such as a laterally positioned photodetector, vertically integrated photodetector, laterally integrated photodetector, dual VCSEL with flip chip photodetector, or the like. In a preferred embodiment the laser chip is direct chip attached (DCA), utilizing mounting means such as epoxy, solder, mounting bumps, or the like to an uppermost surface of the leadframe. The uppermost surface of the leadframe is utilized as a reference point for the positioning of the top emission surface of the VCSEL. In addition, the uppermost surface of the leadframe serves as a reference point during fabrication of the package, and more specifically the z-axis dimensional reference point from the uppermost surface of the leadframe to an optical element.

There is integrally formed within a specific z-axis dimension, a molded structure having optionally formed therein or capable of being positioned thereupon, an optical element including optical properties, such as diffractive and/or holographic optical properties, fabricated in alignment with the path of the laser emission, thereby capable of collimating, and if required redirecting a portion of the emission. Alternatively, the optical element is formed as a separate component and positioned on an uppermost surface of a flat-top plastic molded structure or resting atop a spacer element, so as to properly position the optical element in z-axis alignment relative to the emission aperture of the VCSEL.

The overall package design is formed as a one-piece molded structure, or as a multi-piece molded structure at least partially encapsulating the laser chip and photodetector.

BRIEF DESCRIPTION OF THE DRAWINGS

The novel features believed characteristic of the invention are set forth in the claims. The invention itself, however, as well as other features and advantages thereof will be best understood by reference to detailed descriptions which follow, when read in conjunction with the accompanying drawings, wherein:

DETAILED DESCRIPTION OF THE PREFERRED EMBODIMENT

Figure 1:
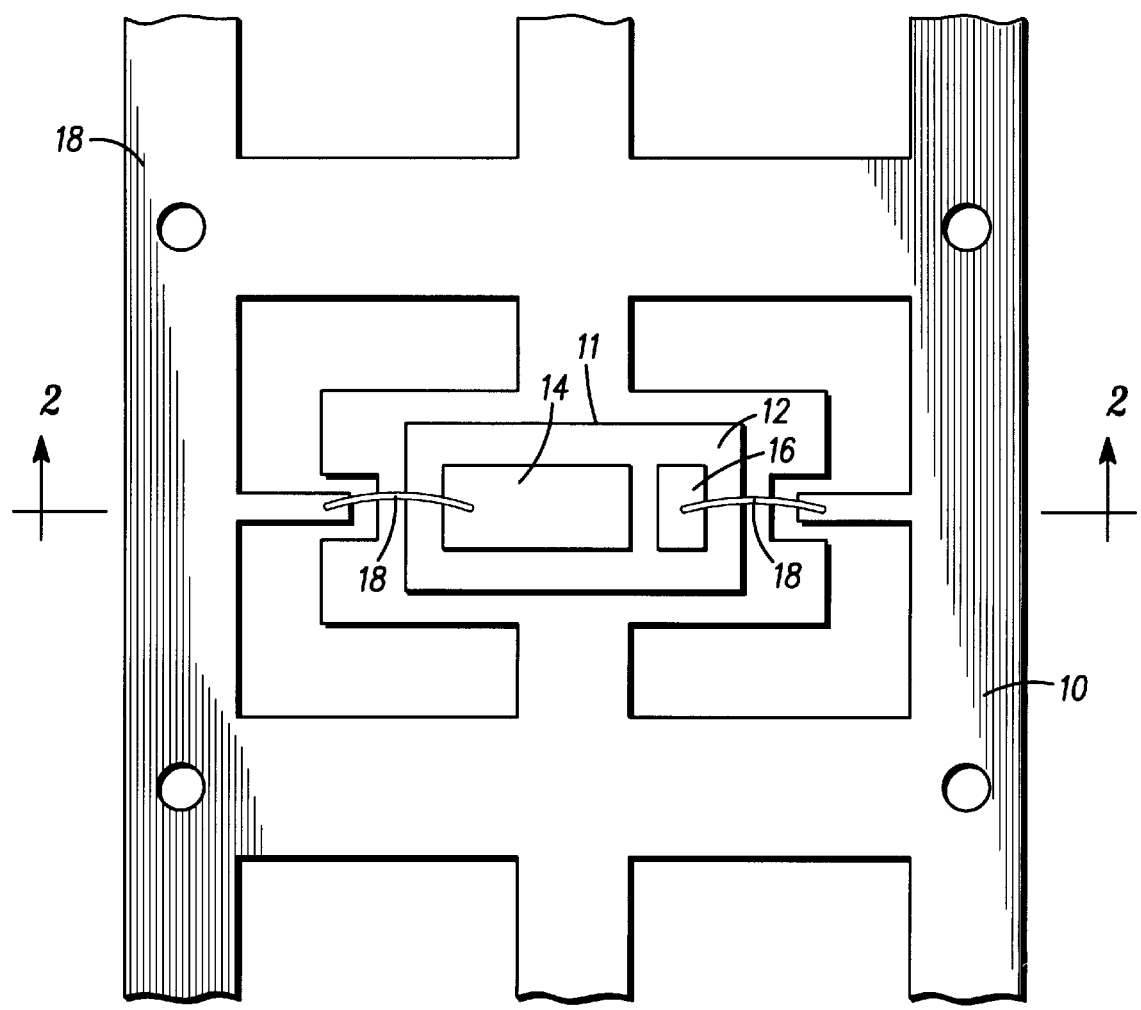
FIG. 1 is a simplified top view of a typical leadframe having mounted thereon a VCSEL and photodetector.
Figure 2:
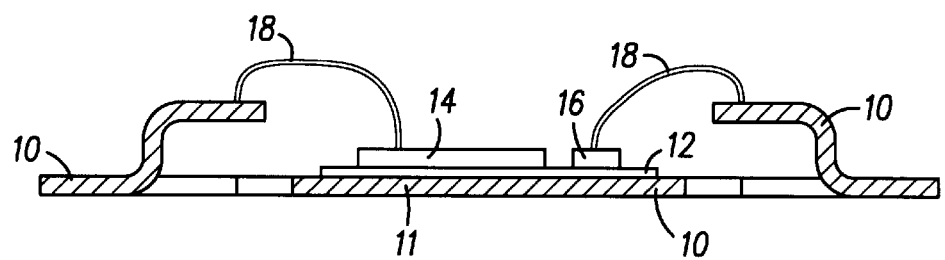
FIG. 2 is a simplified cross-sectional view taken through line 2—2 of FIG. 1.

Turning now to the drawings discussion is first directed FIGS. 1 and 2, illustrating the fabrication and utilization of a leadframe 10 onto which a laser chip 12 is mounted. Leadframe 10 is fabricated using standard leadframe fabrication techniques, such as stamping or the like and includes a central flag portion 11 onto which laser chip 12 is mounted. Laser chip 12 is generally composed of a vertical cavity surface emitting laser 14 (VCSEL) and power monitor 16, namely a photodetector. More specifically, in this particular embodiment included is the formation of a ridge VCSEL having formed as a part thereof a laterally integrated photodetector. It should be noted that power monitor 16 can alternatively be fabricated as a vertically integrated PIN photodetector, a vertically integrated MSM photodetector, a separate laterally positioned photodetector, a dual VCSEL and flip chip photodetector, or the like. It should be understood throughout the description that the specific laser chips, more specifically the VCSEL/photodetector chips, illustrated in the varying embodiments, are being utilized for purposes of this disclosure only and the laser chip of the present invention can utilize any of a wide variety of different types of VCSELs including ridge, planar, those etched through to the structure, etc. as well as any of the wide variety of photodetectors, such as those previously described. In this particular embodiment, VCSEL 14 and photodetector 16 are electrically interfaced with leadframe 10 utilizing a plurality of wire bond interconnects 18.

Briefly, VCSEL 14 of FIG. 1, and similarly for FIGS. 2–6, is fabricated on any suitable semiconductor substrate, such as gallium arsenide, indium phosphide, or the like where the semiconductor substrate provides a surface. A first stack of distributed Bragg reflectors, an active region, and a second stack of distributed Bragg reflectors are epitaxially deposited on the surface by any suitable method, such as molecular beam epitaxy (MBE), metal-organic chemical vapor deposition (MOCVD), or the like. The first stack of distributed Bragg reflectors includes a plurality of layers of semiconductor material with alternating indexes of refraction. The active region is grown on the upper surface of the first stack of distributed Bragg reflectors, which includes one or more quantum wells separated by barrier layers with a spacer and/or cladding layer on either side thereof. The quantum wells and spacer layers are also grown epitaxially. The second stack of distributed Bragg reflectors is formed on the upper surface of the active region by, for example, epitaxially growing pairs of semiconductor layers as described in conjunction with the first stack. The first and second stacks are doped with opposite conductivity types to form a two terminal (diode) structure for the flow of electrical current therethrough. An electrical contact is positioned over the lower surface of the substrate. With the epitaxial depositions being complete, the second stack of distributed Bragg reflectors is patterned to form a ridge. Generally, the VCSEL is made by any suitable well known method in the art, such as photolithography, etching, lift-off, any combination thereof, or the like. By defining a ridge in the second stack of distributed Bragg reflectors, an optical path is defined in the second stack of distributed Bragg reflectors that reflects and guides light formed in the active region. A complete disclosure of the construction of VCSELs, such as that intended for use in the present invention, and more particularly the construction of ridge VCSELs is available in U.S. Pat. No. 5,256,596 entitled "TOP EMITTING VCSEL WITH IMPLANT", issued Oct. 26, 1993, assigned to the same assignee and incorporated herein by this reference.

Once the epitaxial depositions are complete and VCSEL 14 has been formed, a series of depositions and patterning steps are performed to fabricate an integrally formed photodetector 16. Alternatively, and as previously stated, photodetector 16 can be fabricated as a separate device, laterally positioned from VCSEL 14 on the substrate or on a separate substrate, or a second VCSEL can be formed in parallel with VCSEL 14, having a photodetector flip chip mounted thereupon, so as to monitor laser emissions from the second VCSEL, similar to those of VCSEL 14. Generally during fabrication of laser chip 12, composed of VCSEL 14 and photodetector 16, the depositions are performed by any suitable well-known method in the art such as chemical vapor deposition (CVD), plasma enhanced chemical vapor deposition (PECVD), sputtering, or the like. In addition, the patterning steps also are performed by any suitable well-known methods or processes in the art, such as photolithography, lift-off, etching, or combination thereof. Further information and more detailed descriptions regarding the fabrication of specific embodiments of laser chip 12 utilized in the present invention can be found in the following U.S. patent applications: (i) U.S. patent application, Ser. No. 08/672,731, entitled "VCSEL WITH INTEGRATED PIN DIODE", filed on Jul. 1, 1996, assigned to the same assignee and incorporated herein by this reference, (ii) U.S. patent application, Ser. No. 08/675,307, entitled "VCSEL WITH INTEGRATED MSM DIODE", filed on Jul. 1, 1996, assigned to the same assignee and incorporated herein by this reference, (iii) U.S. patent application, Ser. No. 08/673,488, entitled "VERTICAL CAVITY SURFACE EMITTING LASER WITH LATERALLY INTEGRATED PHOTODETECTOR", filed on Jul. 1, 1996, assigned to the same assignee and incorporated herein by this reference, (iv)

U.S. patent application entitled "REFLECTION POWER MONITORING SYSTEM FOR VERTICAL CAVITY SURFACE EMITTING LASERS", Ser. No. 08/639,462, filed on Apr. 29, 1996, assigned to the same assignee and incorporated herein by this reference, and (v) U.S. patent application entitled "FLIP CHIP POWER MONITORING SYSTEM FOR VERTICAL CAVITY SURFACE EMITTING LASERS", Ser. No. 08/641,256, filed on Apr. 30, 1996, assigned to the same assignee and incorporated herein by this reference.

The disclosed embodiment of laser chip 12, more specifically VCSEL 14 with a power monitor serve as the emitting device and the monitoring device in the various embodiments of the semiconductor laser package of the present invention, thus capable of automatic power control (APC) by monitoring the emissions from the VCSEL 14. As previously stated, the monitoring is accomplished by fabricating and/or positioning photodetector 16 to receive and monitor a portion of the emissions passing therethrough or reflected from an optical element designed as a part of the laser package (discussed presently).

Figure 3:
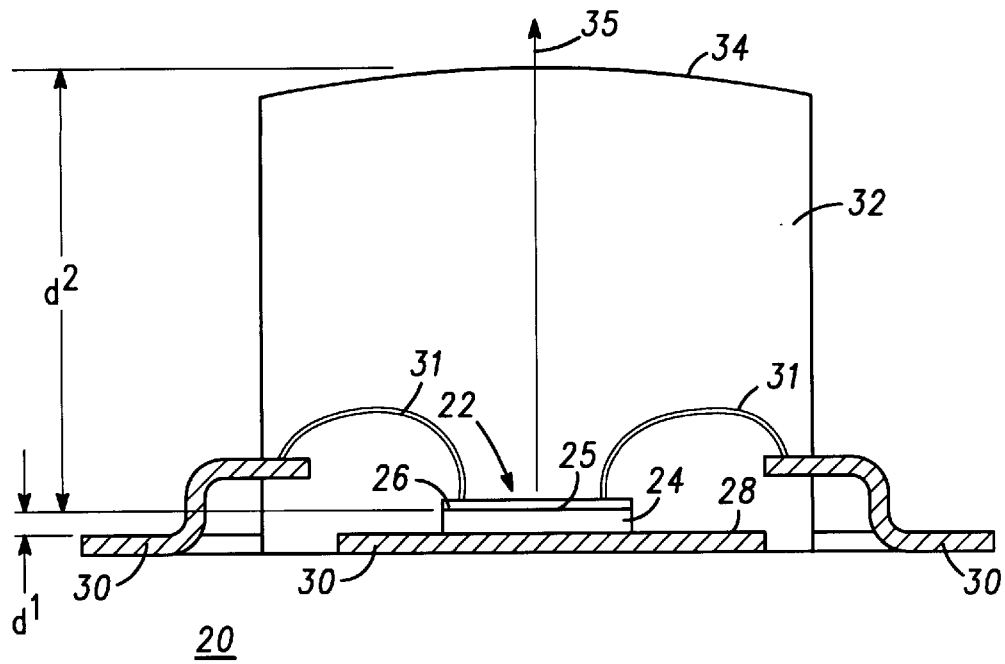
FIG. 3 is a simplified cross-sectional view of a first embodiment of a molded semiconductor laser package encapsulating the laser chip and photodetector of the present invention and having an optical element fabricated as a part thereof.

Referring now to FIG. 3, illustrated is a first disclosed embodiment of a semiconductor laser package 20 according to the present invention. Laser package 20 is fabricated utilizing a one-piece molded unit, fabricated utilizing one molding step. More specifically, laser package 20 is formed of a one-piece molded structure 32 for encapsulation of a laser chip 22. It should be understood that laser chip 22 is generally composed of a VCSEL 24 (similar to ridge VCSEL 14 previously described) and a power monitor 26 that is vertically integrated with VCSEL 24 during the fabrication of laser chip 22. During the fabrication of laser package 20, laser chip 22 is direct chip attached (DCA) utilizing epoxy, solder, a plurality of bonding pads/mounting bumps, or the like to an uppermost surface 28 of a leadframe 30. Laser chip 22, more particularly VCSEL 24 and power monitor 26 are interfaced with leadframe 30 utilizing a plurality of wire bond interconnects 31. Uppermost surface 28 of leadframe 30 will serve as a fixed z-axis reference point of package 20, relative to an emission surface of an optical element (discussed presently). Molded structure 32, defining package 20 is formed next. Molded structure 32 is formed of an optically transparent plastic thereby allowing for the emission therethrough of light from laser chip 22. As stated, uppermost surface 28 of leadframe 30 serves as the reference point for fabrication of an optical element 34, in this particular embodiment fabricated as a curved surface integrally formed with molded structure 32 in optical alignment with laser chip 22. It should be understood that optical element 34 is fabricated to include at least one of diffractive optical properties or holographic optical properties. Optical element 34, in this embodiment, is fabricated as a diffractive lens element, thereby capable of collimating light emitted by laser chip 22, more particularly VCSEL 24. Optical element 34 is fabricated a fixed distance from the uppermost surface 28 of leadframe 30. It should be understood that the emission path from laser chip 22 is generally shown by the directional arrow 35. The distance, referenced here as "$d^1$", between an emission aperture 25, or emission surface, of the laser chip 22 and the uppermost surface 28 of leadframe 30 (the dimensional reference point) will be determined by the thickness of the bonding means, such as epoxy, solder, mounting bumps, or the like. By varying the dimensional height of the mounting means, compensation can be made for variances in laser chip thicknesses while maintaining a specific distance from the emission aperture 25 of chip 22 to an emission window, more particularly to the emission surface of optical element 34. More specifically, compensation for variance is made in distance "$d^1$", the distance from the laser emission aperture 25 of laser chip 22 to the uppermost surface 28 of leadframe 30. The distance "$d^2$" between uppermost surface 28 of leadframe 30 and the emission surface of optical element 34 is a predetermined distance, dependent upon the laser transverse mode characteristics, the laser beam divergence angle and the thickness of laser chip 22, more particularly dimension $d^1$. Accordingly, by utilizing uppermost surface 28 of leadframe 30 as a dimensional reference point, precise z-axis alignment of laser chip 22 can be achieved when fabricating package 20.

Molded structure 32 defining laser package 20 is generally formed of an optically transparent plastic, or an opaque layering over an optically transparent plastic, thereby allowing for passage therethrough of the emission from laser chip 22.

During operation of laser package 20, laser light is emitted by VCSEL 24 and monitored by vertically integrated photodetector 26 as it passes therethrough. The laser emission passes straight through molding structure 32 and is emitted at the emission surface of optical element 34, thereby collimating the light emitted by VCSEL 24.

Figure 4:
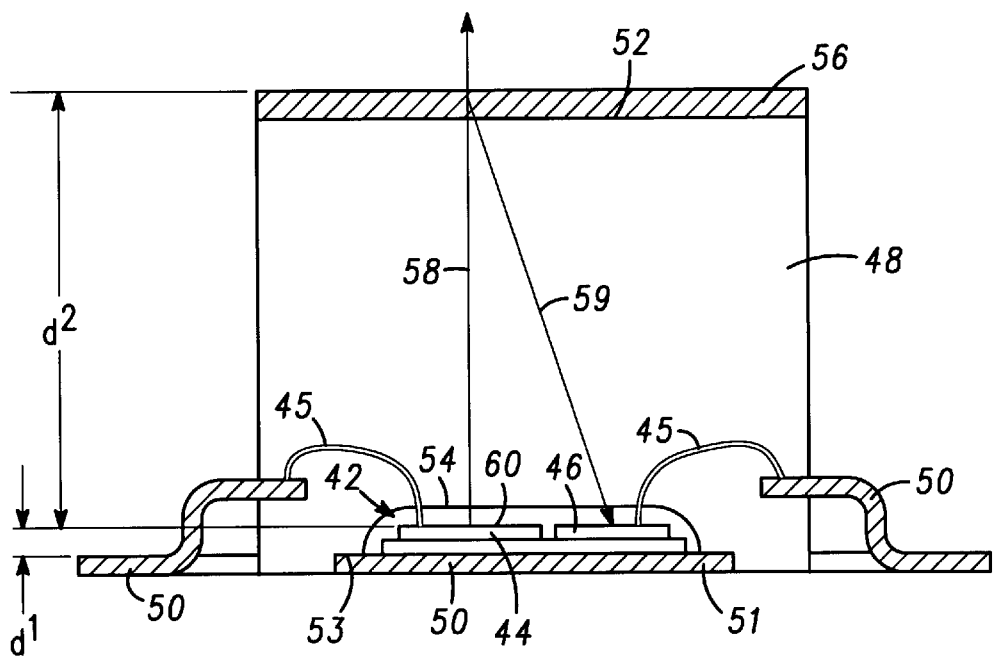
FIG. 4 is a simplified cross-sectional view of a second embodiment of a molded semiconductor laser package encapsulating the laser chip and photodetector of the present invention and having a holographic optical element as a part thereof.

Referring now to FIG. 4, illustrated is a simplified cross-sectional view of a second embodiment of a laser package 40 including a laser chip 42, or more specifically a vertical cavity surface emitting laser 44 (VCSEL) and a power monitor 46, more specifically a laterally integrated photodetector, in accordance with the present invention. As illustrated, laser package 40 is formed generally similar to package 20, previously described. Laser package 40 is fabricated utilizing a plastic resin molded package allowing for positioning of a leadframe 50, thus laser chip 42, relative to a molded structure 48, having formed an uppermost planar surface 52. There is optionally provided an overmolding 54 for protection of laser chip 42. It should be understood that laser chip 42 is generally composed of VCSEL 44 (similar to ridge VCSEL 14 previously described) and photodetector 46 generally fabricated as a laterally integrated photodetector. During the fabrication of laser package 40, laser chip 42 is mounted onto a central flag portion 51 of leadframe 50, having molded thereupon an uppermost surface 53 of leadframe 50, optional overmolding 54 and molded structure 48. VCSEL 44 and photodetector 46 are interfaced with leadframe 50 utilizing a plurality of wire bond interconnects 45. An optical element 56, fabricated in this specific embodiment as a volume hologram, is positioned a distance "$d^2$" from uppermost surface 53 of leadframe 50. Uppermost surface 53 of leadframe 50 will serve as a dimensional reference point from which the optical element 56 is formed a distance therefrom, thereby providing for precise z-axis alignment of optical element 56. It should be understood that in this particular embodiment optical element 56 is fabricated integral with molded structure 48, more specifically stamped onto uppermost planar surface 52 of molded structure 48 utilizing one molding step. Alternatively, optical element 56 is fabricated as a separate component utilizing multiple molding steps in which optical element 56 is optically positioned on uppermost surface 52 of overmolded structure 48 utilizing optically transparent adhesive, thermal adhesion, or the like. Optical element 56 is fabricated to include at least one of diffractive optical properties or holographic optical properties.

It should be understood that molded structure 48 is generally formed of a transparent plastic and therefore serves to allow the laser emission to pass therethrough.

Laser chip 42 is direct chip attached (DCA) utilizing epoxy, solder, a plurality of bonding pads/mounting bumps, or the like to uppermost surface 53 of leadframe 50. The emission path from laser chip 42 is generally shown by the directional arrow 58. The diffracted emission path of approximately 10% of the total laser emission, directed by optical element 56 toward photodetector 46 is shown by directional arrows 59. This directed emission is monitored by photodetector 46. The distance "$d^1$" between the top emission surface, or an emission aperture 60, of laser chip 42 and the uppermost surface 53 of leadframe 50 (the reference point) will be determined by the thickness of the bonding means and the thickness of laser chip 42. The distance "$d^2$" between uppermost surface 53 of leadframe 50 and an emission surface of optical element 56 is determined, dependent upon the laser transverse mode characteristics, the laser beam divergence angle, and distance $d^1$.

Molded structure 48 is formed utilizing injection or transfer molding techniques, common in the art, with a coefficient of thermal expansion (CTE) in a range of 10–30 ppm, with a preferred CTE of 20 ppm or less. Optionally provided overmolding 54 is formed of a material similar to that of structure 48 of package 40 for index matching purposes. Overmolding material such as silicon gel, or any type of polymer that has similar thermal expansion coefficients as that of laser chip 42 can be used to reduce thermal stress, thereby protecting chip 42.

Structure 48 of package 40 has positioned thereupon optical element 56. In this embodiment, optical element 56 generally exhibits holographic properties, more specifically optical element 56 is a volume holographic optical element (HOE), thereby collimating the laser emission from laser chip 42 and directing a portion of the laser emission back toward photodetector 46, thus automatic power control (APC) of VCSEL 44 by photodetector 46. In general, HOEs are used to divide and shape emissions from VCSELs, more specifically laser emissions from laser chip 42. HOE 56 is designed to collimate the transmitted laser emission emitted by VCSEL 44. Diffraction beam 59 from the HOE 56 is received by photodetector 46 of laser chip 42 positioned adjacent VCSEL 44. In the instance where optical element 56 is formed as a separate element, attached to molded structure 48, optical element 56 is fabricated having a generally planar lower aspect, thereby allowing for positioning of optical element 56 on planar surface 52 of overmolded structure 48. In this instance, optical element 56 is typically positioned using any type of an optically transparent adhesive material positioned between an uppermost surface of a planar surface 52 of overmolded structure 48 and the planar lower aspect 57 of optical element 56. As illustrated in FIG. 4, optical element 56 is formed integral with overmolded structure 48 of package 40. More specifically, a hologram material can be deposited onto the molded flat top surface and cured. Laser exposure is then used to form the volume phase hologram pattern that will modify the phase of the transmitted VCSEL emission beam so as to collimate it.

Figure 5:
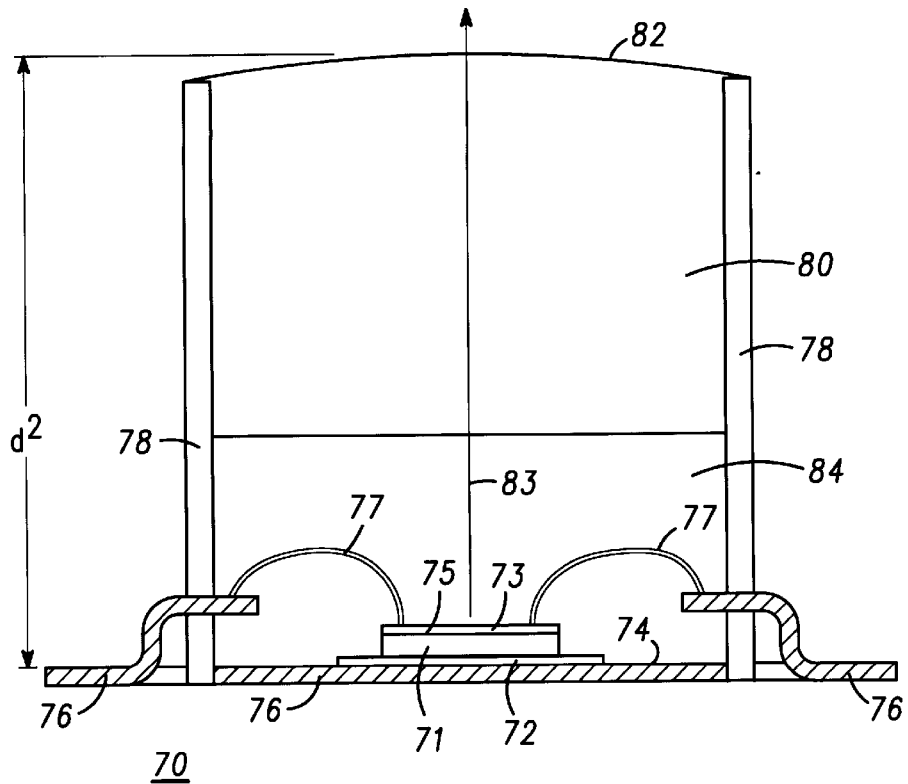
FIG. 5 is a simplified cross-sectional view of a third embodiment of a molded semiconductor laser package fabricated utilizing spacer elements and having an optical element positioned thereupon.

Referring now to FIG. 5, illustrated is a simplified cross-sectional view of a laser package 70. In this particular embodiment, laser package 70 generally includes a laser chip 72, direct chip attached to an uppermost surface 74 of a leadframe 76 utilizing epoxy, solder, a plurality of bonding pads/mounting bumps, or the like. In general, laser chip 72 includes a VCSEL 71 and a vertically integrated photodetector 73 for automatic power control (APC). It should be understood that VCSEL 71 and photodetector 73 can be fabricated as illustrated in FIG. 5 in which photodetector 73 is positioned on top of an uppermost surface of VCSEL 71, or alternatively VCSEL 71 and photodetector 73 can be fabricated in reverse order whereby VCSEL 71 is positioned on top of photodetector 73. Laser chip 72, more particularly VCSEL 71 and photodetector 73 are interfaced with leadframe 76 utilizing a plurality of wire bond interconnects 77. Alternatively, photodetector 73 can be formed as a flip chip type detector (previously described) or package 70 can be formed without the inclusion of a means for automatic power control, as can any of the included disclosed embodiments of the present invention with minor alterations.

Leadframe 76 has molded into a part thereof and thereupon, a molded structure fabricated as a multi-piece molded unit, fabricated utilizing multiple molding steps. More particularly, the molded structure includes a spacer element 78, composed of some rigid material, capable of resisting thermal expansion and contraction. Spacer element 78 is typically formed of an opaque molded plastic, ceramic, metal, or some other similar material, capable of maintaining dimensional parameters during thermal expansion and contraction. There is provided an injection molded material 80 having integrally formed as a part thereof an optical element 82 including at least one of diffractive optical properties or holographic optical properties. More specifically, optical element 82 is formed so as to "sit" or "rest" upon an uppermost surface of spacer 78, thereby providing for proper z-axis alignment of optical element 82 relative to an emission aperture 75 of laser chip 72. This proper z-axis alignment allows for the path of laser emission, illustrated by directional arrow 83, to pass therethrough photodetector 73 and through an emission surface of optical element 82. There is provided within an area defined by spacer 78 and injection molded material 80, some filler material 84, such as a polymer material or molding compound, that is thermally matched to laser chip 72, or the area is simply left unfilled having air enclosed therein. As in the previous embodiments, an uppermost surface 74 of leadframe 76 serves as a dimensional reference point for the fabrication of the emission surface of optical element 82. More specifically, optical element 82 is fabricated a distance, referenced in FIG. 5 as "$d^2$", from uppermost surface 74 of leadframe 76 dependent upon laser transverse mode characteristics, the laser beam divergence angle, and the thickness of laser chip 72. Laser chip 72 is direct chip attached (DCA) to uppermost surface 74 of leadframe 76 utilizing epoxy, solder, a plurality of bonding pads/mounting bumps, or the like. This ability to direct chip attach laser chip 72 to leadframe 76 allows for adjustment in mounting height during fabrication. This adjustment in mounting height is required in that die thickness variation and the DCA mounting will affect the z-axis alignment of the overall package.

Figure 6:
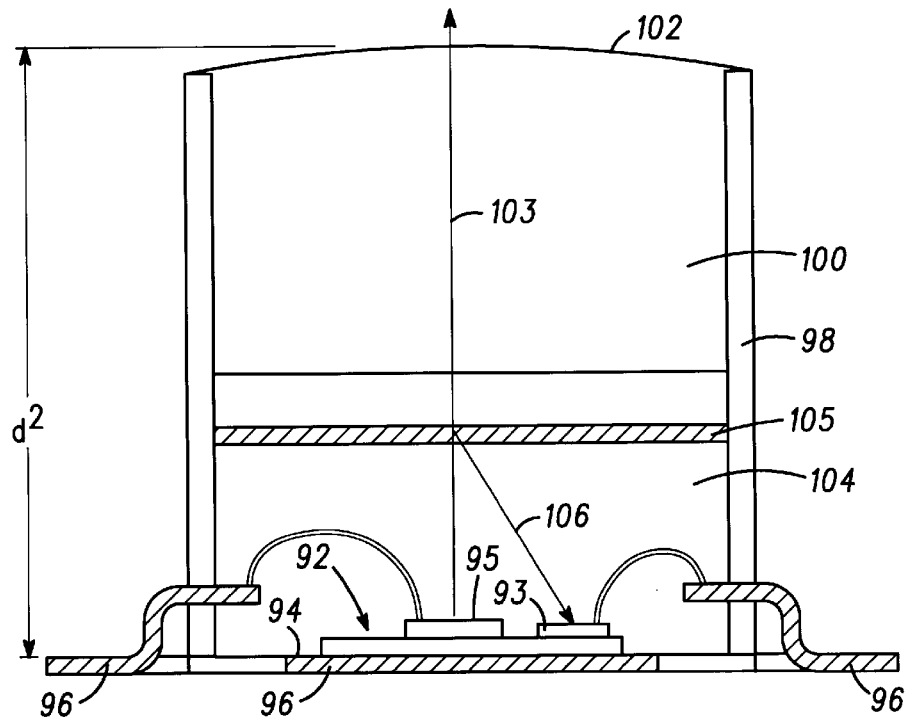
FIG. 6 is a simplified cross-sectional view of a fourth embodiment of a molded semiconductor laser package fabricated utilizing spacer elements, overmolding encapsulating a VCSEL and a photodetector, and further including an optical element and a holographic positioned as a part of the package.

Referring now to FIG. 6, illustrated is a simplified cross-sectional view of a laser package 90, generally similar in fabrication to laser package 70, previously described. In general, there is provided a laser chip 92, direct chip attached to an uppermost surface 94 of a leadframe 96 utilizing epoxy, solder, a plurality of bonding pads/mounting bumps, or the like. In this specific embodiment, laser chip 92 includes a VCSEL 91 and a vertically integrated photodetector 93 for automatic power control (APC).

Leadframe 96 has molded into a part thereof and thereupon, a molded structure 98, more particularly a spacer element, composed of some rigid material, capable of resisting thermal expansion and contraction. Spacer element 98 is formed similar to spacer element 78 of FIG. 5, more specifically typically formed of an opaque molded plastic, ceramic, metal, or some other similar material, capable of maintaining dimensional parameters during thermal expansion and contraction. There is provided an injection molded material 100 having integrally formed as a part thereof an optical element 102. More specifically, optical element 102 is formed so as to "sit" or "rest" upon spacer 98, thereby providing for proper z-axis alignment of optical element 102 relative to an emission aperture 95 of laser chip 92 and the collimating of the laser emission passing therethrough. This precise z-axis alignment allows for the path of laser emission, illustrated by directional arrow 103, to pass through an emission surface of optical element 102. There is provided within an area defined by spacer 98 and injection molded material 100, a material 104, such as a polymer material, silicon gel, a molding compound or some other optically transparent material that is thermally matched to laser chip 92. Material 104 is formed utilizing injection or transfer molding techniques, common in the art, with a coefficient of thermal expansion (CTE) in a range of 10–30 ppm, with a preferred CTE of 20 ppm or less. Material 104 has similar thermal expansion coefficients as that of laser chip 92. Material 104 allows for the placement of an optical element 105 on an uppermost surface, as illustrated a holographic optical element (HOE), therefore providing for a portion of laser emission 103 to be directed back toward photodetector 93 as illustrated by directional arrow 106. There is provided an air gap 107 positioned between optical element 105 and a lower aspect of injection molded material 100.

As in the previous embodiments, an uppermost surface 94 of leadframe 96 serves as a dimensional reference point for the fabrication of an emission surface of optical element 102. More specifically, spacer element 98 is fabricated to position optical element 102 a specific distance, referenced in FIG. 6 as "d²", from uppermost surface 94 of leadframe 96 dependent upon laser transverse mode characteristics, the laser beam divergence angle, and the thickness of laser chip 92. As in the previous embodiments, laser chip 92 is direct chip attached (DCA) to uppermost surface 94 of leadframe 96 utilizing epoxy, solder, a plurality of bonding pads/mounting bumps, or the like. This ability to direct chip attach laser chip 92 to leadframe 96 allows for adjustment in the mounting height of laser chip 92 during fabrication. This adjustment in mounting height is required in that die thickness variation and the DCA mounting will affect the z-axis alignment of the overall package.

It is disclosed that any of the above-described embodiments and specific element of the package of the present invention can be combined, more particularly the attachment of the leadframe, thus enclosure of the laser chip within a one-piece or multi-piece molded structure, wherein an optical element is capable of being properly aligned along a z-axis relative to the laser chip. Accordingly, it is further disclosed to form the optical element, or mold the uppermost planar surface of the molded structure of the present invention, to provide for the optical element through which the laser emission passes therethrough.

Due to the low power operation of vertical cavity surface emitting lasers in general, thermal dissipation of such plastic packages disclosed in the previous embodiments should not be a problem. Although, as previously stated there is optionally provided a transparent epoxy or an underfill type material, with a coefficient of thermal expansion (CTE) equivalent to the laser chip, thereby providing a buffer prior to the molding of the plastic structure about the device as illustrated in FIGS. 4 and 5.

Thus, a molded semiconductor laser package is disclosed. More specifically, provided is a package that allows for precise z-axis positioning of a laser chip mounted on a leadframe within a molded structure having formed as a part thereof, or positioned thereon, an optical element for collimating the generated laser emission. More specifically, there is provided housed within the package a vertical cavity surface emitting laser having optionally provided as a separate device or formed integral therewith, a photodetector. An optical element formed separate or integral with the package is positioned within the emission path of the vertical cavity surface emitting laser, thereby serving to permit a substantial portion of the laser emission to pass therethrough. The package allows for the fabrication of the package relative to a distance from a reference point, here an uppermost surface of a leadframe. The leadframe is positioned a specific distance from an emission surface of the optical element thereby achieving proper and precise z-axis alignment of the laser chip within the laser package.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A semiconductor laser package comprising:
    a laser chip, including a vertical cavity surface emitting laser generating an emission along a path and a photodetector optically positioned to receive a diffracted emission from an optical element positioned parallel with an uppermost surface of the laser chip wherein the photodetector is utilized for automatic power control of the vertical cavity surface emitting laser, the laser chip being mounted to an uppermost surface of a leadframe; and
    a molded structure mounted on the uppermost surface of the leadframe, thereby providing for proper z-axis alignment of the optical element relative to an emission aperture of the vertical cavity surface emitting laser, the optical element positioned in optical alignment with the vertical cavity surface emitting laser, the emission generated by the vertical cavity surface emitting laser capable of passing therethrough.

2. A semiconductor laser package according to claim 1 wherein the mounting of the laser chip to an uppermost surface of the leadframe utilizes one of an epoxy, a solder and a plurality of mounting bumps.

3. A semiconductor laser package according to claim 2 wherein the photodetector is one of carried adjacent the vertical cavity surface emitting laser, vertically integrated with the vertical cavity surface emitting laser, or laterally integrated with the vertical cavity surface emitting.

4. A semiconductor laser package according to claim 2 wherein the molded structure is formed as a one-piece molded unit, fabricated in one molding step.

5. A semiconductor laser package according to claim 2 wherein the molded structure is formed as a multi-piece molded unit, fabricated utilizing multiple molding steps.

6. A semiconductor laser package according to claim 5 wherein the molded structure is comprised of a spacer element and an optical element.

7. A semiconductor laser package according to claim 2 wherein the optical element is fabricated to include at least one of diffractive optical properties and holographic optical properties.

8. A semiconductor laser package according to claim 7 wherein the optical element is integrally formed with the molded structure.

9. A semiconductor laser package according to claim 7 wherein the optical element is formed as a separate component, capable of being optically positioned in the path of the emission.

10. A semiconductor laser package according to claim 2 wherein the distance between the optical element and the uppermost surface of the leadframe is determined by at least one of transverse mode characteristics, beam divergence angle of the vertical cavity surface emitting laser and dimension from the uppermost surface of the leadframe to the emission aperture of the vertical cavity surface emitting laser.

11. A semiconductor laser package as claimed in claim 2 further including an underfill material positioned about the laser chip, whereby the underfill material and the laser chip have similar coefficients of thermal expansion.

12. A semiconductor laser package comprising:
   a laser chip, including a vertical cavity surface emitting laser generating an emission along a path and a photodetector optically positioned to receive a diffracted portion of the emission for automatic power control of the vertical cavity surface emitting laser, the laser chip being mounted to an uppermost surface of a leadframe; and
   a molded structure, including an optical element fabricated a fixed distance from an uppermost surface of the leadframe, the distance determined by at least one of transverse mode characteristics, beam divergence angle of the vertical cavity surface emitting laser and distance from an emission aperture of the vertical cavity surface emitting laser to the uppermost surface of the leadframe, the optical element in parallel alignment with an uppermost emission region of the vertical cavity surface emitting laser, the emission generated by the vertical cavity surface emitting laser capable of passing therethrough.

13. A semiconductor laser package according to claim 12 wherein the molded structure is formed as a one-piece molded unit, fabricated utilizing one molding step.

14. A semiconductor laser package according to claim 12 wherein the molded structure is formed as a multi-piece molded unit, fabricated utilizing multiple molding steps.

15. A semiconductor laser package according to claim 12 wherein the optical element is formed integral the molded structure.

16. A semiconductor laser package according to claim 12 wherein the optical element is formed separate the molded structure.

17. A semiconductor laser package according to claim 12 wherein the optical element includes at least one of holographic optical properties and diffractive optical properties, thereby capable of at least one of diffracting, collimating and focusing the laser emission.

18. A semiconductor laser package according to claim 12 wherein the photodetector is one of carried adjacent the vertical cavity surface emitting laser, vertically integrated with the vertical cavity surface emitting laser, or laterally integrated with the vertical cavity surface emitting laser.

19. A method of fabricating a semiconductor laser package comprising the steps of:
   providing a laser chip, composed of a vertical cavity surface emitting laser generating an emission along a path and a power monitoring system for automatic power control of the vertical cavity surface emitting laser;
   mounting the laser chip on an uppermost surface of a leadframe utilizing one of an epoxy, a solder and a plurality of mounting bumps;
   molding a molded structure on the uppermost surface of the leadframe at least partially encapsulating the laser chip; and
   providing at least one optical element in optical alignment with the vertical cavity surface emitting laser, the at least one optical element including optical properties to diffract a portion of the laser emission toward the power monitoring system for automatic power control of the vertical cavity surface emitting laser, a remaining portion of the laser emission generated by the vertical cavity surface emitting laser capable of passing therethrough.

20. The method of fabricating a semiconductor laser package according to claim 19 wherein the step of molding the molded structure includes molding a spacer element, capable of positioning the optical element in proper z-axis alignment relative to an emission aperture of the vertical cavity surface emitting laser.

21. The method of fabricating a semiconductor laser package according to claim 19 wherein the step of molding the molded structure includes molding a one-piece molded structure, fabricated utilizing one molding step.

22. The method of fabricating a semiconductor laser package according to claim 19 wherein the step of molding the molded structure includes molding a multi-piece molded structure, fabricated utilizing multiple molding steps.

23. The method of fabricating a semiconductor laser package according to claim 19 wherein the step of providing at least one optical element includes fabricating an optical element integral the molded structure.

24. The method of fabricating a semiconductor laser package according to claim 19 wherein the step of providing at least one optical element includes fabricating an optical element as a separate component, capable of attachment to the molded structure.

* * * * *